(12) United States Patent
Shih et al.

(10) Patent No.: US 6,466,881 B1
(45) Date of Patent: Oct. 15, 2002

(54) METHOD FOR MONITORING THE QUALITY OF A PROTECTIVE COATING IN A REACTOR CHAMBER

(75) Inventors: Hong Shih, Walnut; Joe Sommers, San Jose; Diana Ma, Saratoga, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/298,073

(22) Filed: Apr. 22, 1999

(51) Int. Cl.$^7$ .............................................. C23C 14/34
(52) U.S. Cl. ............................ 702/84; 702/24; 702/33; 702/81; 702/127
(58) Field of Search ............................ 702/24, 33–36, 702/40, 81–84, 117, 118, 127, 128, 170, 172, 182–185, 188, 60, FOR 103, FOR 104, FOR 106, FOR 115, FOR 116, FOR 119, FOR 123–125, FOR 134–135, FOR 137, FOR 148, FOR 170–171; 118/723 T, 723 E, 723 MW, 723 MA; 156/345

(56) References Cited

U.S. PATENT DOCUMENTS

| | | | | |
|---|---|---|---|---|
| 4,244,743 A | * | 1/1981 | Blackburn et al. .............. 106/55 |
| 4,262,631 A | * | 4/1981 | Kubacki ...................... 118/723 |
| 4,556,587 A | * | 12/1985 | Tsiamis et al. .............. 427/304 |
| 4,582,729 A | * | 4/1986 | Tsiamis et al. .............. 427/304 |
| 4,883,686 A | * | 11/1989 | Doehler et al. ................ 427/38 |
| 5,603,983 A | * | 2/1997 | Clough et al. ........... 427/126.3 |
| 5,641,375 A | | 6/1997 | Nitescu et al. ............... 156/345 |
| 5,680,013 A | * | 10/1997 | Dornfest et al. ......... 315/111.21 |
| 5,690,795 A | * | 11/1997 | Rosenstein et al. ...... 204/192.1 |
| 5,746,875 A | * | 5/1998 | Maydan et al. .............. 156/345 |
| 5,753,044 A | * | 5/1998 | Hanawa et al. .......... 118/723 E |
| 5,800,617 A | * | 9/1998 | Sandhu ...................... 118/722 |
| 5,820,947 A | * | 10/1998 | Itoh .......................... 427/577 |
| 5,837,093 A | * | 11/1998 | Hasegawa et al. ........... 156/345 |
| 5,846,332 A | * | 12/1998 | Zhao et al. .................. 118/728 |
| 5,916,370 A | | 6/1999 | Chang ........................ 118/729 |
| 5,952,060 A | | 9/1999 | Ravi .......................... 427/577 |
| 5,976,309 A | * | 11/1999 | Almgren ..................... 156/345 |
| 6,063,441 A | * | 5/2000 | Koai et al. ................ 427/248.1 |
| 6,073,576 A | * | 6/2000 | Moslehi et al. .......... 118/723 E |
| 6,074,512 A | * | 6/2000 | Collins et al. .............. 156/345 |
| 6,106,630 A | | 8/2000 | Frankel ...................... 118/728 |
| 6,123,791 A | * | 9/2000 | Han et al. ...................... 156/1 |
| 6,132,566 A | * | 10/2000 | Hofmann et al. ....... 204/192.17 |
| 6,224,724 B1 | * | 5/2001 | Licate et al. ........... 204/298.06 |

FOREIGN PATENT DOCUMENTS

| | | | | |
|---|---|---|---|---|
| EP | 1001455 | 5/2000 | ........... H01L/21/00 |

* cited by examiner

*Primary Examiner*—Marc S. Hoff
*Assistant Examiner*—Carol S Tsai
(74) *Attorney, Agent, or Firm*—Shirley L. Church; Joseph Bach (57) ABSTRACT

A method for determining the quality of a protective coating or layer on a structure inside of a reactor chamber. The method includes generating a basis, such as a standard scatter band of impedance, as an acceptable standard for the quality of a protective layer on the inside of a reactor chamber. At least one substrate is processed within a reactor chamber containing a protective coating for protecting the inside of the reactor chamber during processing of the substrate. The method further includes determining the quality of the protective coating, such as by measuring protective characteristics of the protective coating. A method for on-line monitoring of a quality of a coating on the inside of a reactor chamber.

3 Claims, 10 Drawing Sheets

METHOD FOR MONITORING THE QUALITY OF A PROTECTIVE COATING IN A REACTOR CHAMBER

BACKGROUND OF THE INVENTION

1. Field of the Invention

This invention relates to a method for determining the quality of a protective coating located on a structure. More specifically, this invention provides a method for on-line monitoring of the quality of aluminum anodization on the inside of a reactor chamber wherein semiconductor substrates are processed in a plasma of a processing gas.

2. Description of the Prior Art

Aluminum hard anodization has been widely used in the semiconductor industry for years due to its unique properties, such as high corrosion resistance and surface micro-hardness, low cost, low contamination levels, manufacturing capability, and ease of application. Anodization is a major coating applied to a structure within a plasma reactor chamber, such as reactor walls, gas distribution plates (GDPs), chamber lids, and pedestals for electrostatic chuck application. In recent years, a tremendous amount of work has been done to find new materials or new surface coatings to replace aluminum hard anodization. Although there has been great progress in identifying new materials and new coatings, the complete replacement of aluminum anodize with new chamber materials or coatings is presently not foreseeable in the near future.

Aluminum anodize quality depends on many factors, such as the texture of the raw aluminum alloys, the type of aluminum alloy used, masking, cleaning, and post treatment processes. Therefore, the use of very detailed procedures for aluminum anodizing process, for control of the content and level of impurities in the anodize line, and for statistical process control (SPC) are critical. In a plasma reactor the difference between a good and bad aluminum anodize can have a 10 to 20 times difference in lifetime of the aluminum anodize. Aluminum anodize failure can occur in all types of reactor structures, such as reactor lids and in the pumping-port area. The failure of aluminum anodization may not only cause gas (e.g., $Cl_2$) flow verification issues, but may also provide $Al_2O_3$ particles which can damage the production wafer. Traditional anodization analytical techniques, such as dielectric voltage breakdown, have played an important role in the past to provide critical information for the correct assessment of aluminum anodize quality, but none of these analytical techniques have the capabilities of providing more relevant critical information on aluminum anodize, such as corrosion resistance. Also, none of the traditional analytical techniques have the capability of in-situ monitoring the quality of aluminum anodize.

Therefore, what is needed and what has been invented is a method for determining the quality of a protective coating (e.g., aluminum hard anodization) located on the inside of a reactor chamber where semiconductor substrates are processed (e.g., by etching, vapor deposition, etc.) in a plasma of a processing gas. What is further needed and what has been invented is a method for on line monitoring of the quality of a coating or layer supported by a structure on the inside of a reactor chamber.

SUMMARY OF THE INVENTION

The present invention broadly provides a method for determining the quality of a protective coating on the inside of a reactor chamber wherein substrates are processed comprising the steps of:

a) generating a basis (e.g. a standard scatter band of impedance) as an acceptable standard for the quality (e.g. protective characteristics such as resistance to corrosion/erosion, etc).

b) processing (e.g. etching, depositing a layer on, etc) at least one substrate in a reactor chamber containing a protective coating for protecting the inside of the reactor chamber during processing of the at least one substrate; and c) determining the quality of the protective coating after the processing of step (b).

In the foregoing method for determining the quality of a protective coating, the determining of step (c) comprises measuring protective characteristics of the protective coating and comparing the measured protective characteristics with the generated basis of step (a) which preferably contains standard protective characteristics that are acceptable in quality for processing substrates. The measuring of the protective characteristics of the protective coating comprises contacting the protective coating with a first electrode, and coupling a second electrode to a chamber structure supporting the protective coating.

The present invention also broadly provides a method for determining the quality of a layer on a structure in a reactor chamber after processing substrates therein. The method comprises the steps of:

a) providing a reactor chamber containing a chamber structure (e.g. a reactor chamber wall, a gas distribution plate, a rector chamber lid, a pedestal, etc.) supporting a chamber layer (e.g., anodized aluminum) having characteristics acceptable for processing substrates;

b) generating a standard scatter band of impedance from a set of coupons wherein each of the coupons supports a respective coupon layer having characteristics acceptable for use on the chamber structure in the reactor chamber of step (a);

c) disposing a substrate in the reactor chamber of step (a);

d) introducing a processing gas into the reactor chamber of step (a);

e) introducing processing power into the reactor chamber of step (a) for processing (e.g., etching or depositing) a layer on the substrate in a plasma of the processing gas, causing the chamber layer of the chamber structure to develop post-processing characteristics;

f) determining an impedance spectra of the chamber layer of step (e); and g) determining if the impedance spectra of step (f) for the chamber layer of step (e) falls within the standard scatter band of impedance of step (b), indicating that the chamber layer of step (e) with the post-processing characteristics is acceptable in quality for processing of substrates.

In the foregoing method for determining the quality of a layer on a structure, the determining of step (f) comprises contacting the chamber layer with an electrode and coupling the chamber structure to another electrode. The chamber structure may be any suitable structure such as a chamber wall, a gas distribution plate, a chamber lid, a pedestal, or any of the like. The standard scatter band of impedance has a lower limit, and the determining step (g) comprises determining if the impedance spectra is located above the lower limit, indicating that the step (e) chamber layer possesses an acceptable quality for continuing the processing of substrates.

The present invention further also accomplishes its desired objects by broadly providing a method for on-line monitoring of the quality of a coating on the inside of a reactor chamber for processing substrates comprising the steps of:

a) generating a standard scatter band of impedance from a set of coupons wherein each of said coupons supports a respective coupon layer having characteristics acceptable for providing a protective layer on a structure in a reactor chamber wherein substrates are processed;

b) disposing a substrate in a reactor chamber containing a chamber structure supporting a protective coating to protect the chamber structure from processing conditions resulting from processing of the substrate within the reactor chamber;

c) processing the substrate of step (b) within the reactor chamber, causing the protective coating on the chamber structure to be affected;

d) determining an impedance spectra for the affected protective coating of step (c);

e) comparing the impedance spectra of step (d) with the standard scatter band of impedance of step (a) and determining that the affected protective coating is acceptable in quality for continuing the processing of substrates;

f) processing at least one additional substrate within the reactor chamber, causing the protective coating on the chamber structure to be further affected;

g) determining an impedance spectra for the further affected protective coating; and h) comparing the impedance spectra of step (g) with the standard scatter band of impedance of step (a) for on-line monitoring of the quality of the protective coating on the chamber structure and to determine if the further affected protective coating is acceptable in quality for continuing the processing of substrates.

The present invention also broadly provides a chamber assembly for processing substrates in a plasma of a processing gas. The chamber assembly includes a processing chamber having a chamber coating, and a processing zone wherein substrates are processed. A pedestal assembly is disposed in the processing zone and has a receiving surface for receiving a substrate. A first electrode contacts the chamber coating and a second electrode is coupled to the processing chamber. The chamber assembly further includes a processing power source; a processing gas-introducing assembly, engaged to the processing chamber, for introducing a processing gas into the processing chamber; and a processing power-transmitting member connected to the processing power source for transmitting power into the processing zone to aid in sustaining a plasma from a processing gas within the processing zone of the processing chamber. The processing chamber comprises a chamber wall supporting a dielectric window. The chamber coating may be supported by the chamber wall and the second electrode may be respectively coupled to the chamber wall. Preferably, the first electrode and the second electrode is coupled to an EIS measurement and data acquisition system.

The foregoing provisions along with various ancillary provisions and features which will become apparent to those skilled in the art as the following description proceeds, are attained by the practice of the present invention, a preferred embodiment thereof shown with reference to the accompanying drawings, by way of example only, wherein:

BRIEF DESCRIPTION OF THE DRAWINGS

FIG. 3 is a Bode impedance-phase angle plot for 3 test coupons to determine if the corrosion-resistance characteristics for the three test coupons are similar;

DESCRIPTION OF THE PREFERRED
EMBODIMENTS OF THE INVENTION

The present invention provides a method for determining the quality (e.g. protective characteristics) of a protective coating or layer on the inside of a reactor chamber wherein one or more semiconductor substrates are provided. The method of the present invention employs a basis as (and representing) an acceptable standard for the quality (e.g. resistance to corrosion/erosion) of a protective coating or layer. The basis is preferably generated, produced, or otherwise obtained by electrochemical impedance spectroscopy (EIS) as described in *Computer Modeling in Corrosion*, published in 1992 by the American Society for Testing and Materials (ASTM, Philadelphia, Pa.) and fully incorporated herein by reference thereto. EIS is also described in *Electrochemical Impedance: Analysis and Interpretation*, published in 1993 by ASTM and also fully incorporated herein by reference thereto.

Electrochemical impedance spectroscopy (EIS) has been widely used in corrosion research and electrochemical kinematic study, and has many advantages in comparison with other electrochemical techniques. EIS is a non-destructive method for the evaluation of a wide range of materials, including coatings, anodized films, and corrosion inhibitors, and can provide detailed information of the systems under examination, such as corrosion rate, electrochemical mechanisms and reaction kinetics, and detection of localized corrosion. The main purposes of corrosion research are the analysis of the causes and the mechanisms of corrosion processes, the quantitative determination of corrosion rates, and the achievement of effective corrosion protection by alloying, applying coatings or protective surface layers, adding inhibitors, or applying polarization (cathodic and anodic protection).

During EIS experiments, a small signal perturbation (e.g., an amplitude sinusoidal AC signal) is applied to the system being studied, and the transfer function of the system under investigation can be obtained. The transfer function contains the complete information of the system behavior. The importance of the transfer function for dynamic systems can be compared with that of the basic equation(s) for thermodynamics.

In a preferred embodiment of the present invention, EIS is used to characterize systems (e.g., coatings, layers, and similar structures) by applying a small amplitude sinusoidal perturbation. With the ac voltage perturbation in a wide range of frequencies, the response of the systems can be measured by frequency domain analysis well known to those skilled in the art.

Figure 1:
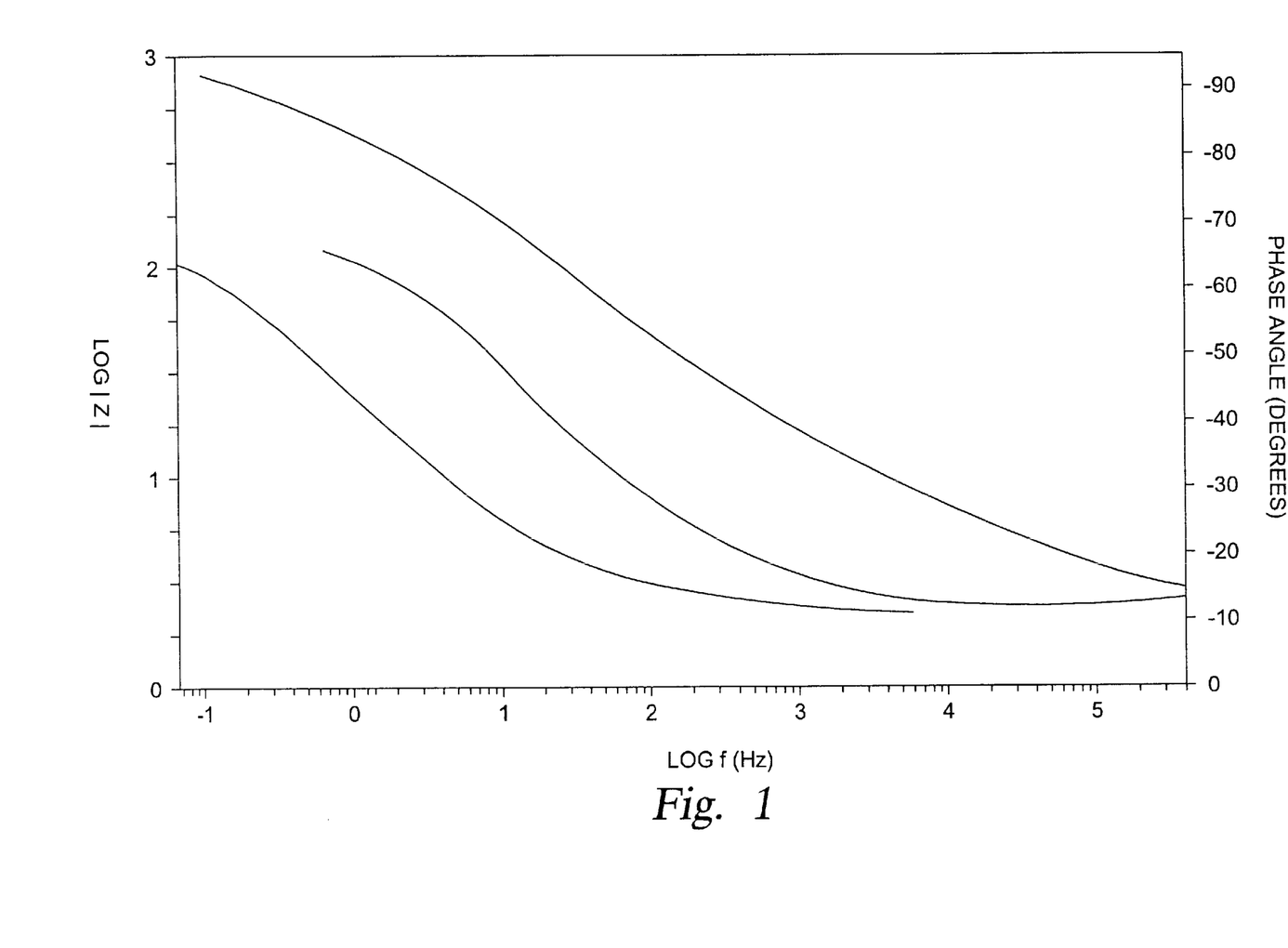
FIG. 1 is a Bode impedance plot of three groups of coatings, plotting impedance against frequency.

The basic equations of EIS are shown below:

$$Z = Z' + Z''$$

$$|Z| = (Z'^2 + Z''^2)^{1/2}$$

and $$\phi = \arctan(Z''/Z')$$

where $Z$ is the total impedance, $Z'$ the real part of impedance and $Z''$ the imaginary or virtual part of impedance, $|Z|$ the modulus of the impedance, and $\phi$ the phase angle $Z$, $Z'$, $Z''$, $|Z|$, and $\phi$ are function of frequencies. Frequencies of sinusoidal perturbation from $10^7$ Hz to $10^{-4}$ Hz can provide enough information of systems under study. A Bode-phase angle plot may be developed by plotting $\log|Z|$ and $\phi$ versus $\log f$, as shown in FIG. 1.

The systems to be characterized in accordance with the present invention may be any coating or layer on any structure within a reactor chamber, generally illustrated as 8 (see FIG. 2) wherein semiconductor wafers or substrates 10 are processed, such as by etching with plasma 12 for patterning integrated circuit (IC) metal interconnect devices. Other forms of processing substrates which are included within the spirit and scope of the present invention include chemical vapor deposition and physical vapor deposition. During the plasma process, processing power (e.g., RF power, magnetron power, microwave power, etc.) passes through a dielectric member, which includes a dielectric window of a nonconductive material such as a ceramic dome, etc., and becomes coupled to a plasma of the processing gas. If the plasma process is plasma etching, metal etching of metals (e.g., platinum, copper, aluminum, titanium, ruthenium, iridium, etc.) is conducted while being supported by substrates.

Figure 2:
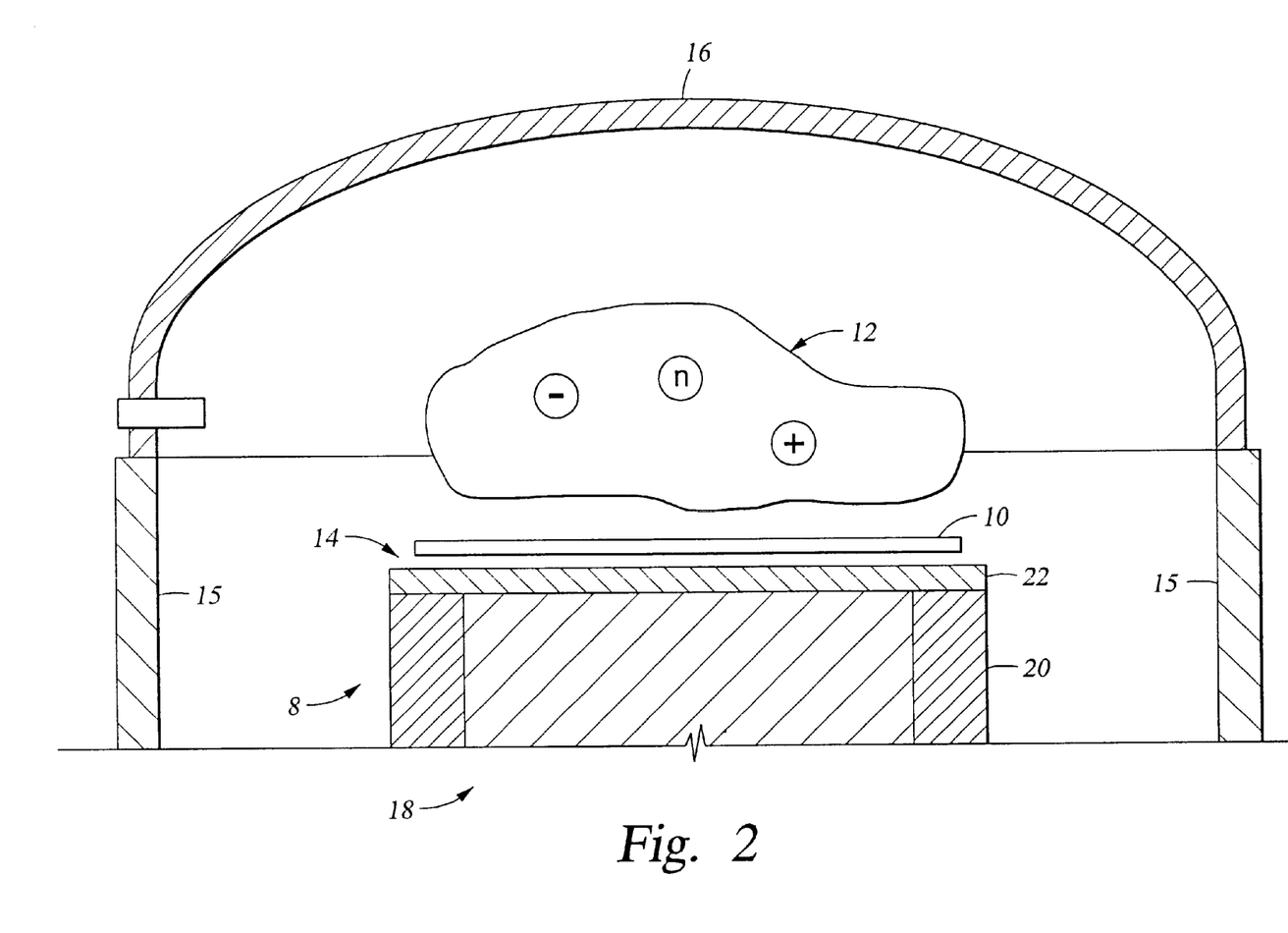
FIG. 2 is a sectional view of a plasma reactor chamber.

The reactor chamber 8 may be from any suitable reactor, such as helium source reactor, helical resonator reactor, CER electron resonance cyclotron source, and inductively coupled plasma reactor. The structure within the reactor chamber 8 supporting the system for characterization may be any suitable structure such as reactor chamber walls 15, gas distribution plates (not shown), reactor chamber lids 16 and pedestal or chuck assemblies. For purposes of illustrating the present invention, a pedestal assembly generally illustrated as 14, is provided having a chuck assembly, generally illustrated as 18, for supporting a substrate, such as substrates or semiconductor wafers 10, while being processed within the process chamber 8. The chuck assembly 18 includes a chuck member 20 which preferably supports a chuck member 22 for supporting the substrate 10.

In accordance with one preferred embodiment of the present invention and as previously indicated, a basis, or bench mark, is generated by employing the scatter band technique, which is a statistical analysis of a number of electrochemical impedance spectra generated from the same group of test coupons (i.e., samples of metal submitted by a supplier to a customer for approval). Each of the test coupons supports a respective coupon layer having characteristics acceptable for use on a chamber structure in a processing chamber or reactor chamber (i.e., the reactor chamber 8). Typically, the test coupons are anodize aluminum coupons wherein the coupon layer is anodize aluminum. For example, and assuming anodize aluminum coupons are the same group of test coupons, a certain number (e.g., 3 to 15) of anodize coupons from the same supplier are measured by EIS from 1 MHz to 0.001 Hz. If the electrochemical impedance spectra of the test coupons show very similar results (e.g., are within an acceptable deviation such as ±15% of the average impedance for each frequency) on Bode-impedance and Bode-phase angle plots, then the statistical analysis of the scatter band technique may be subsequently conducted by initially obtaining the average impedance and phase angle values of the test coupons at each frequency and then obtaining, producing or generating a scatter band of impedance from the average impedance and phase angle values of the test coupons at each frequency. Preferably, the scatter band of impedance is obtained, produced or generated by producing, generating or obtaining, such as by a suitable curve fitting technique (e.g. least square method), the average impedance and phase angle of the test coupons for all of the frequencies. The next step in the statistical analysis of the scatter band technique is to obtain, produce or generate the lower and upper limits of impedance and phase angle values for all of the frequencies, based on the average impedance and phase angle values of the test coupons for all of the frequencies, by proposing a standard deviation (e.g. a standard deviation ranging from about 1 to about 6) to set the lower and upper limits. The bands between the lower and upper limits of the impedance spectra collected as Bode-impedance and Bode-phase angle plots are called standard scatter bands of impedance. If the electrochemical impedance spectra of the layer or coating (e.g. anodize aluminum) under study fall within the bands and/or into the standard scatter band of impedance, the layer or coating (e.g. anodize aluminum) passes. If the electrochemical impedance spectra of the layer or coating fall on the lower limit of the standard scatter band, the quality of the layer or coating is marginal. If the electrochemical impedance spectra of the layer or coating fall below the lower limit, the layer or coating under study fails.

Figure 3:
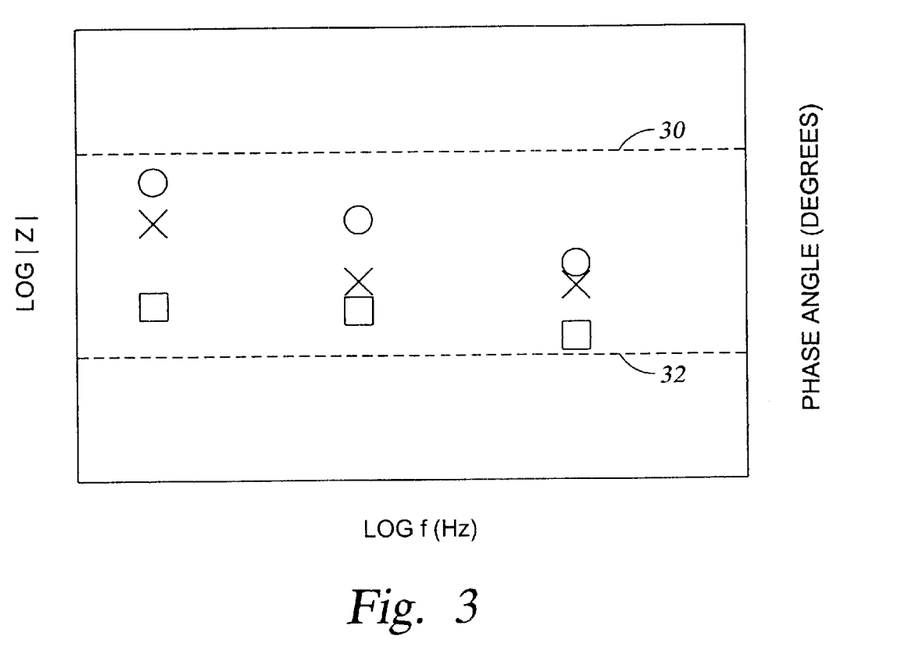
Figure 4:
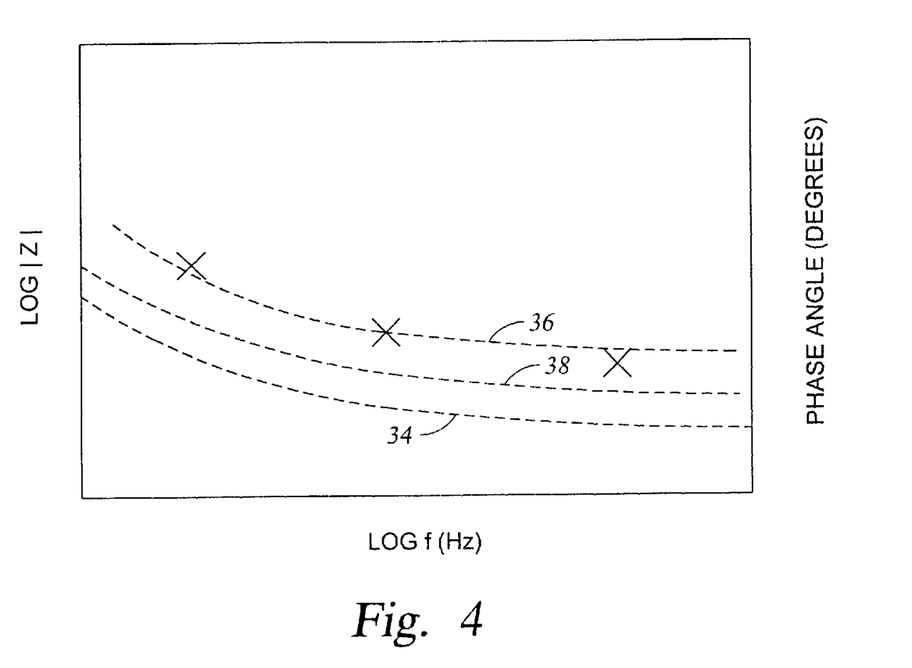
FIG. 4 is a Bode impedance-phase angle plot of the three test coupons of FIG. 3 after obtaining average impedance and phase angle values at each frequency of testing and after producing a least square curve fit (i.e., the average impedance and phase angle values for all of the frequencies of testing) for the three test coupons.
Figure 5:
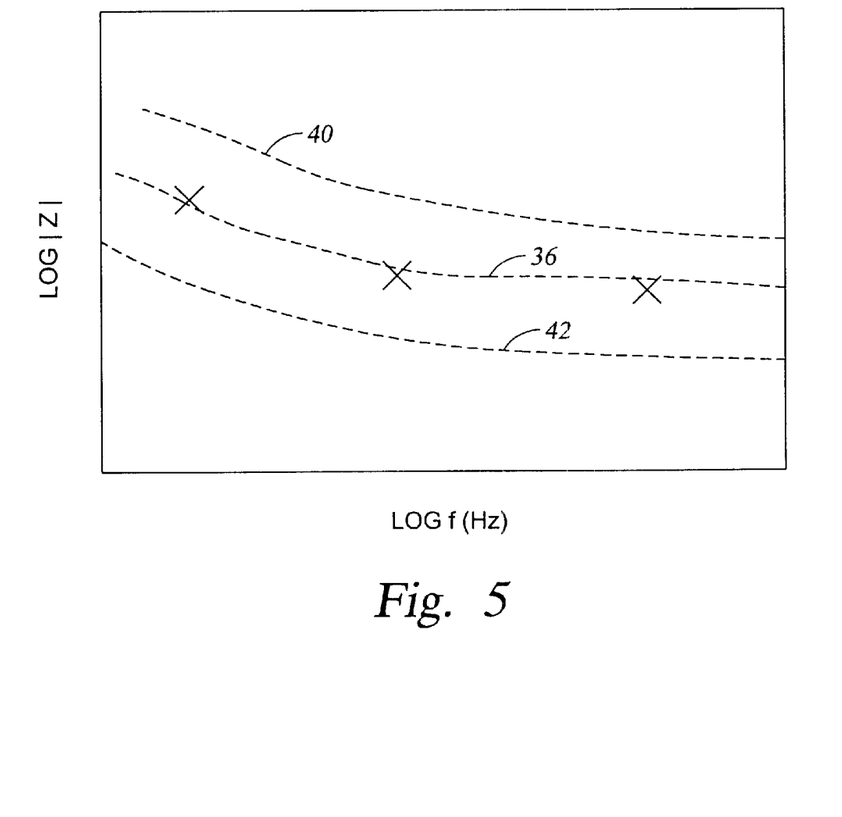
FIG. 5 is a standard scatter band plot for the three test coupons produced from the least square curve fit in FIG. 4.

Referring now to FIGS. 3–5 for further explanation of the scatter band technique of the present invention and assuming there are three test coupons supporting coupon layers having characteristics acceptable for use on a chamber structure in reactor chamber 8, the three test coupons are measured by EIS for a suitable range of frequencies. Assuming that the EIS results of the three test coupons are shown in the Bode-phase angle plots in FIG. 3, the electrochemical impedance spectra of the test coupons in FIG. 3 show similar results in that the electrochemical impedance spectra fall within or between impedance values represented by dotted lines 30 and 32 which were predetermined as acceptable upper and lower limits for "similar results." The next step for the statistical analysis is to obtain an average impedance and phase angle values of the three test coupons at each frequency, which is represented in FIG. 4.

In one embodiment of the invention, a lower limit 34 may be established for the averaged values in FIG. 4, by any suitable manner, such as by "eye-balling" in the lower limit 34 based on the knowledge of intended use of the coupon layer of the test coupons. If an impedance spectra of a layer or coating under study is located above the lower limit 34, the layer/coating is of acceptable quality for resisting erosion/corrosion. If the impedance spectra of the layer/coating falls below the lower limit 34, the layer/coating is not acceptable. In another preferred embodiment of the invention, a scatter band of impedance is established or obtained for the averaged impedance/phase angle values of the three test coupons for all the frequencies where the average impedance/phase angle values were obtained. The scatter band of impedance may be established or obtained in any suitable manner. In a preferred embodiment of the invention, the scatter band of impedance (i.e. the average impedance/phase angle values of the three test coupons at all the frequencies) is obtained by a least square curve-fit method, the results of which are represented by or as curve 36 in FIG. 4.

In one preferred embodiment of the invention, a lower limit 38 may be established for the scatter band of impedance in FIG. 4 by any suitable manner, such as by "eye-balling" in the lower limit 38 based on knowledge of intended use of the coupon layer of the test coupons. If an impedance spectra of a layer or coating under study is located above the lower limit 38, the layer/coating has acceptable, erosion/corrosion-resistant qualities. If the impedance spectra of the under-study layer/coating falls below the lower limit 38, the under-study layer/coating is not acceptable. In another preferred embodiment of the present invention a standard scatter band of impedance is established or obtained for the averaged impedance/phase angle values of the three test coupons for or at all of the frequencies where the average impedance/phase angle values were obtained. A standard scatter band of impedance results in obtaining or producing a lower limit and upper limit for the scatter band of impedance or curve 36 in FIG. 4 and FIG. 5. As best shown in FIG. 5, a lower limit 40 and upper limit 42 for the scatter band of impedance or curve 36 is obtained or produced by proposing a standard deviation ±STD.DEV. (e.g. a standard deviation ranging from about ±1 to about ±6) from the scatter band of impedance or curve 36. If the impedance spectra of a layer or coating under study fall within or into the produced standard scatter band of impedance (i.e., between the upper limit 40 and lower limit 42), the under-study layer or coating passes and is of acceptable erosion/corrosion resistant quality. If the impedance spectra of the under-study layer/coating fall below the lower limit 42, the under-study layer or coating is not acceptable in erosion/corrosion resistant quality and it fails. It is to be noted that the pass/fail criteria for a layer or coating under study is mainly determined by the scatter band of Bode-impedance and the scatter band of Bode-phase angle is used as a secondary pass/fail criteria. Because the phase angle is very sensitive and contains additional information as to the structure of the under-study layer or coating, the Bode-phase angle is very helpful in making a final determination as to pass or fail.

The scatter band technique for the present invention is typically conducted with a computer. The data file of the standard scatter band of impedance is saved and loaded in the computer. The impedance spectra of the sample (coating or layer) being assessed is then loaded in the computer. If calculations by the computer determine that the impedance spectra of the sample under study fall into the standard scatter band of impedance, the sample passes. If the impedance spectra of the sample falls on the lower limit of the standard scatter band, the quality of the sample is marginal. If the impedance spectra of the sample fall below the lower limit, the sample fails. In a preferred embodiment of the invention, final judgment of pass or fail is preferably based on pre-analysis of the impedance spectra on Model 1 (shown in FIG. 15 and described below) or Model 2 (shown in FIG. 13 and described below) and the resulting interface parameters, such as Rpo, Rb, Cpo, Cb and CPE which are all described hereinafter.

Figure 9:
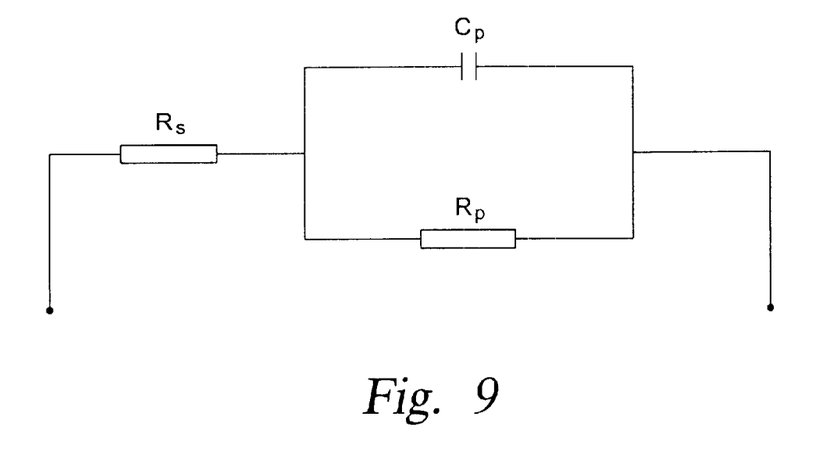
FIG. 9 is an equivalent circuit model.
Figure 10:
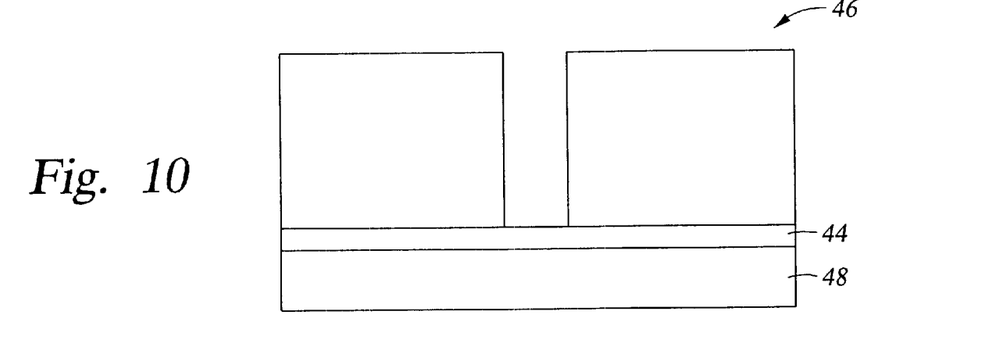
FIG. 10 is a layered structure.
Figure 11:
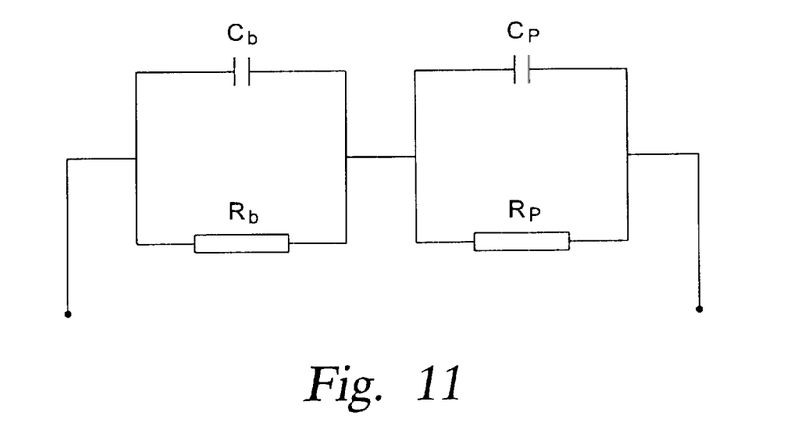
FIG. 11 is an equivalent circuit model for the layered structure in FIG. 10.
Figure 14:
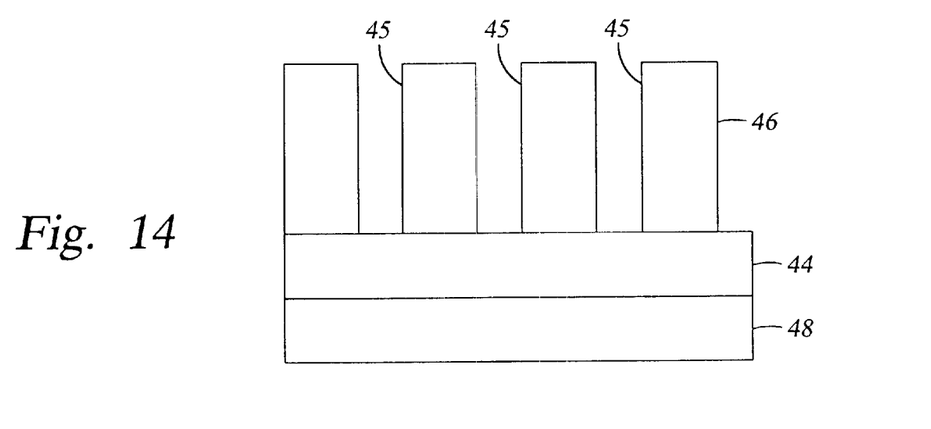
FIG. 14 is an anodized layered structure representing Model 1.
Figure 15:
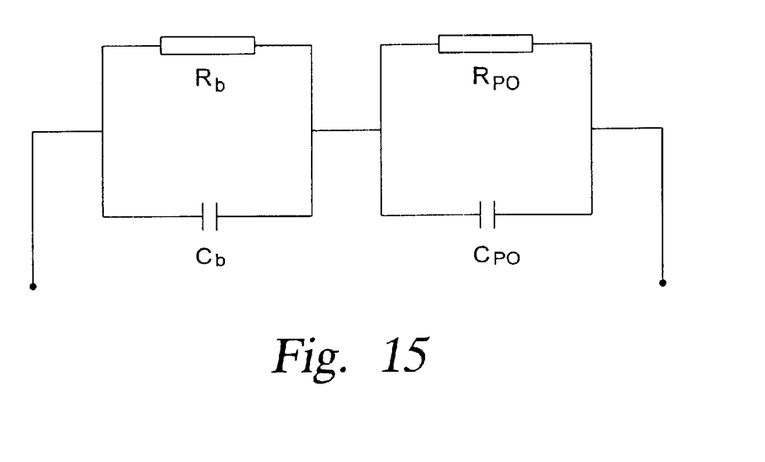
FIG. 15 is an equivalent circuit model for Model 1 of FIG. 14.

In a preferred embodiment of the present invention, EIS measurements and scatter band techniques are applied to study anodize aluminum based on its fundamental layered structure. While the discussion hereinafter pertains to anodize aluminum as the sample under study, it is to be understood that the spirit and scope of the present invention would include any other suitable sample under study as the coating or layer within a plasma reactor, such as reactor 8. It is well-known that anodization has at least a two layer structure. In its simplest form, anodize aluminum has an inner dense layer referred to as the barrier layer 44, with a porous layer 46 over the top of the barrier layer 44 (see FIGS. 10 and 12). The barrier layer 44 is supported by an aluminum alloy substrate 48. Thickness of barrier layer 44 depends on the applied voltage during anodization, with a resultant 12–14Å of thickness increase per applied volt. The barrier layer 44 is thin, dense, and very corrosion-resistant. The outer porous layer 46 is porous and is less corrosion resistant. If the thick porous layer 46 can be treated correctly, the corrosion resistance of the anodize aluminum can be increased dramatically. For a non-sealed anodize aluminum, such as type III without DI water seal, the corrosion resistance is mainly contributed by the very thin barrier layer 44 (several hundred Angstroms only). Improvement of the porous layer 46 leads directly to the overall corrosion resistance, and greatly enhances anodize aluminum lifetime. A simplified anodize layer structure may be described using an equivalent circuit model. A simple model and its elements are shown in FIG. 9, where Cp is coating capacitance, Rs is the resistance of a solution (e.g., solution or fluid, identified as "78" below, in a chamber, identified as "76" below), and Rp is polarization resistance. Corrosion current $I_{corr}$ may be calculated by dividing B (a well known constant) by Rp. FIG. 10 is a layered structure, and FIG. 11 is the corresponding equivalent circuit model for the layered structure of FIG. 10, where Cb and Cp are the capacitance for the barrier layer 44 and the porous layer 46, respectively. Another simple model and its elements are shown in FIG. 14, wherein Rpo is the corrosion resistance of the porous layer 46, which is predominated by the resistance of the pores 45, and Cpo is the capacitance. Rb and Cb are barrier layer 44 corrosion resistance and capacitance, respectively. Since electrolyte or ionic species can penetrate through the pores 45 of the porous layer 46, the corrosion resistance of the non-sealed anodize aluminum is relatively low, and the porous layer 46 has little contribution to the overall corrosion/erosion resistance of anodize aluminum. the equivalent circuit of FIG. 14 as Model 1 is shown in FIG. 15.

Figure 12:
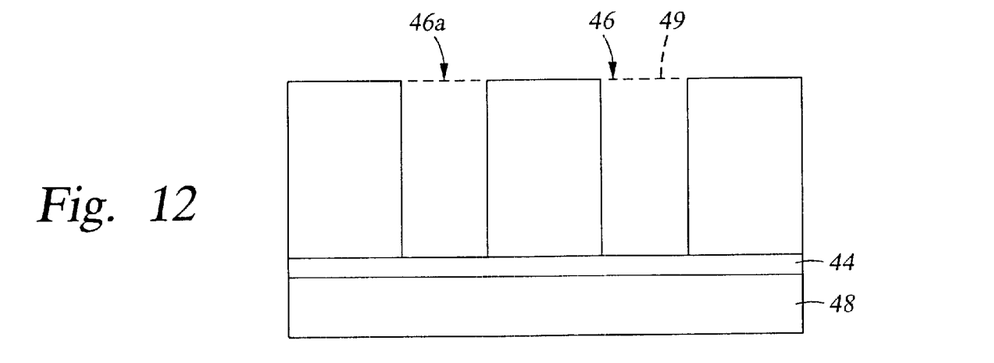
FIG. 12 is an anodized layered structure representing Model 2.
Figure 13:
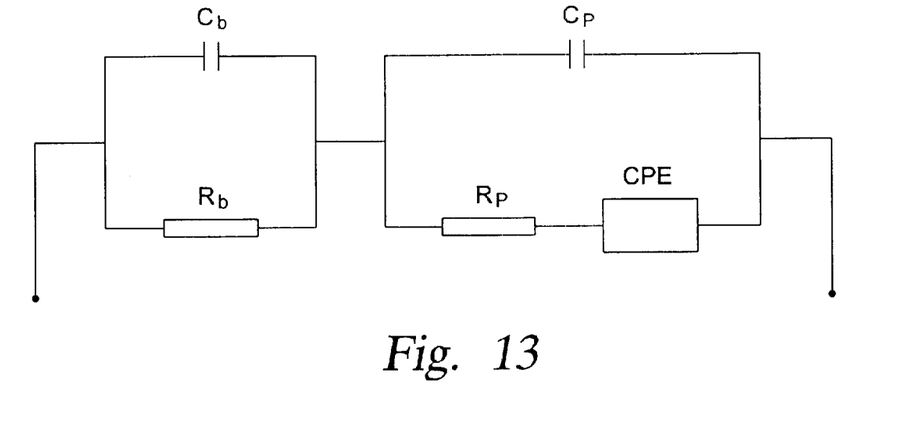
FIG. 13 is an equivalent circuit model for Model 2 of FIG. 12.

When anodize aluminum is sealed, such as sealed in hot DI water, the pores of the outer porous layer 46 are gradually filled with AlO(OH) through a slow chemical reaction in the sealing process. For a type III anodize aluminum with 3 mil thickness, usually three hour sealing time is required. Corrosion/erosion resistance of anodize aluminum after DI water sealing increases dramatically. An interface model to describe DI water sealed anodize aluminum is illustrated in FIG. 13 and referenced as Model 2. CPE is introduced in this model as a constant phase element which represents the contribution of the mass transfer process of electrolyte or ionic species through the porous layer 46. Since the pores of the outer porous layer 46 are sealed with boehmite AlO(OH) 49, the corrosion/erosion resistance equals the combined contribution from boehmite 49, the outer alumina layer (i.e., the pores-filled porous layer 46a as best shown in FIG. 12), and the mass transfer process. Usually, the corrosion/erosion resistance increases.

As was previously indicated for a preferred embodiment of the invention, during EIS measurement a small amplitude of ac signal with 10 to 20 mV around the equilibrium potential of anodize samples in electrolyte is applied. Preferably, a wide range of frequencies usually starting at 1 MHz and ending at 1 MHz is selected. Since the applied perturbation signal is so small, there is no damage to the anodize from EIS measurements. EIS tests may be carried out over a period of time to obtain corrosion resistance/time relation. It has been discovered that even after a prolonged 30 day EIS test, no degradation of dielectric voltage breakdown was observed. This indicates that there was either no damage from EIS measurements or no corrosion occurring on anodize coupons in the 30 day time period.

Figure 6:
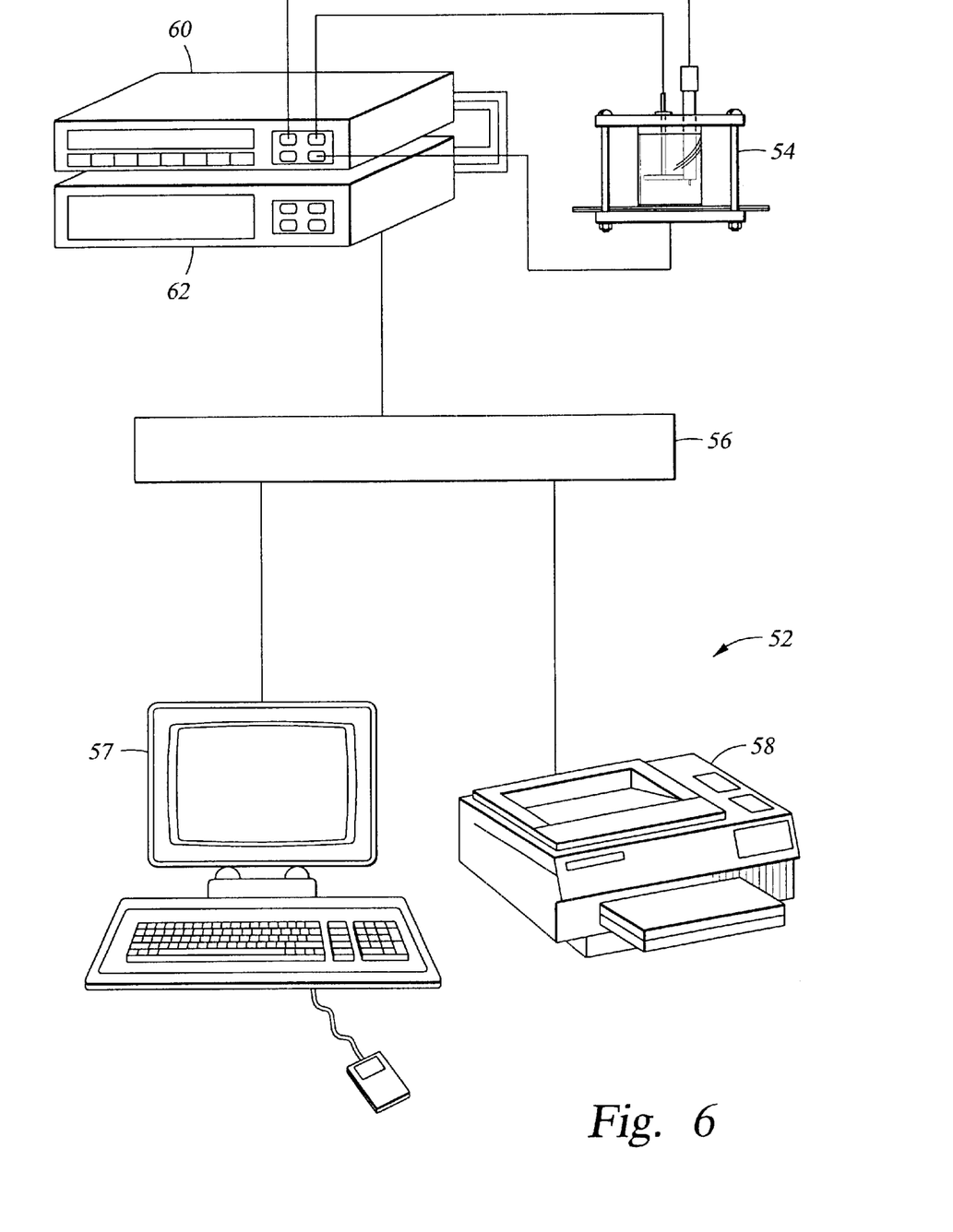
FIG. 6 is a schematic diagram of a prior art EIS measurement and data acquisition system.
Figure 7:
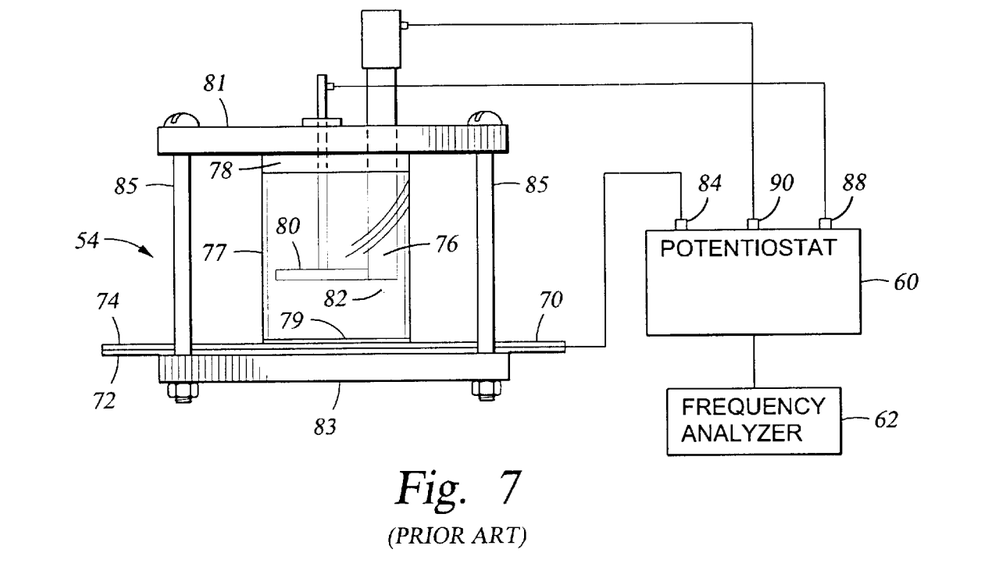
FIG. 7 is a schematic side elevational view of a coating impedance measuring device.
Figure 8:
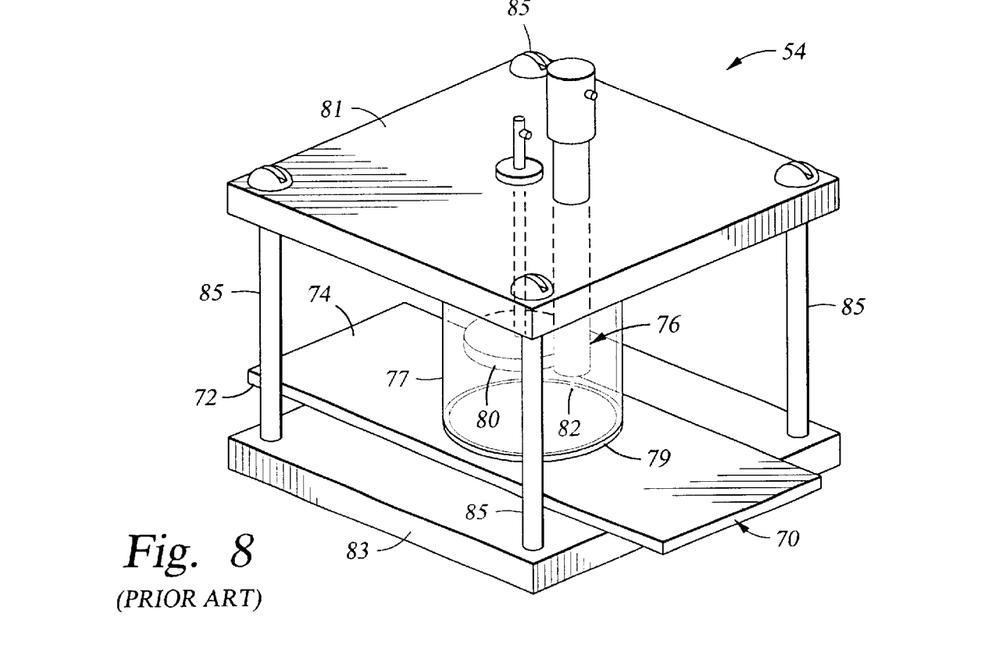
FIG. 8 is a perspective view of the coating impedance measuring chamber illustrated in FIG. 6.

The EIS measurements may be conducted with any apparatus or system, such as that shown in FIGS. 6–8. Referring in detail now to FIGS. 6–8 wherein similar parts are identified by like reference numerals, there is seen in FIG. 6 schematic diagram of an electrochemical impedance spectroscopy (EIS) measurement and data acquisition system 52 which may be employed for determining the quality of protective coating or layer which is supported by a structure (e.g., a chamber wall, a gas distribution plate, etc) located on the inside of a reactor chamber (e.g., reactor chamber 8) wherein substrates (e.g., substrates 10) are processed in a plasma (e.g., plasma 12) of a processing gas. The EIS measurement and data acquisition system 52 includes a controller 56 which is electrically engaged to a computer 57 and to a printer 58. A frequency analyzer 62 is coupled to the controller 56, and a potentiostat is coupled to the frequency analyzer 62 and to a cell assembly 54.

The cell assembly 54 may be any suitable cell assembly such as a prior art cell assembly (i.e., a coating impedance measuring device) as disclosed in U.S. Pat. No. 5,373,734 to Shih et al., incorporated herein by reference thereto. FIG. 7, a figure from U.S. Pat. No. 5,373,734, is a schematic side elevational view of the cell assembly 54 including the potentiostat 60 and the frequency analyzer 62. FIG. 8 is also a FIG. from U.S. Pat. No. 5,373,734 and is a perspective view of the cell assembly 54, illustrated in FIG. 7.

FIGS. 7 and 8 show a coated plate 70 which may be any structure from a reaction chamber, such as reactor chamber 8. The coated plate 70 comprises a plate of conducting material 72 (i.e., aluminium alloy), with a coating 74, which is to be tested. The coating 74 to be tested may be any various materials representing a layer or coating of the reactor chamber 8, such as aluminum hard anodization, etc. As described in U.S. Pat. No. 5,373,734, the coated plate 70 is placed in a chamber 76 containing a fluid 78 with an ionic substrate. In this embodiment, the chamber is formed by a cylindrical wall 77 held against the plate 70, with a seal between the cylindrical wall 77 and the plate being provided by an O-ring 79, so that the plate 70 forms the bottom of the chamber 76. A top piece 81 forms a cover and a top support for the chamber 76. A bottom piece 83 forms a bottom support for the chamber 76 and the plate 70. The top piece 81 and the bottom piece 83 are mechanically connected by bolts 85. A counter electrode 80 is formed by a large plate within the fluid 78 within the chamber 76. A reference electrode 82 is also placed in the fluid 78 within the chamber 76. The plate of conducting material 72 is electrically connected to a working electrode terminal 84 of the potentiostat 60. The counter electrode 80 is electrically connected to a counter electrode terminal 88 of the potentiostat 60. The reference electrode 82 is electrically connected to a reference electrode terminal 90 of the potentiostat 60.

In operation, the coated plate 70 with the coating 74 to be tested is placed in the chamber 76 and is electrically connected to the working electrode terminal 84 of the potentiostat 60. The coated plate 70 is placed in position so that the coating 74 is between the plate of conducting material 72 and the counter electrode 80 and the reference electrode 82, and so that the coated plate 70 is substantially parallel to the counter electrode 80 as shown in FIGS. 7 and 8. The potentiostat 60 applies an a.c. signal of 10 mv amplitude between the working electrode terminal 84 and the reference electrode terminal 90 at a frequency of 1 Hertz. The frequency of the voltage signal is controlled by a frequency response analyzer 62. The impedance may be calculated from the applied voltage signal and current response using the equation $Z=V/I$, where Z is the impedance, V is the applied voltage and I is the current response. If the impedance is below a certain resistance, such as 20 ohms, then the coating 74 is determined to be a poor coating.

In other preferred embodiments of the present invention, other frequencies in the range of 0.1 to 100 Hertz may be used. Other embodiments may use frequencies up to 10,000 Hertz. A Bode impedance plot may be obtained by plotting impedance against frequency over a frequency range from 0.1 Hz to 65,000 Hz. As was previously mentioned and as illustrated in FIGS. 1 and 3–5, the logarithm of the impedance is plotted along the vertical axis and the frequency is plotted along the horizontal axis on a logarithm scale.

Figure 16:
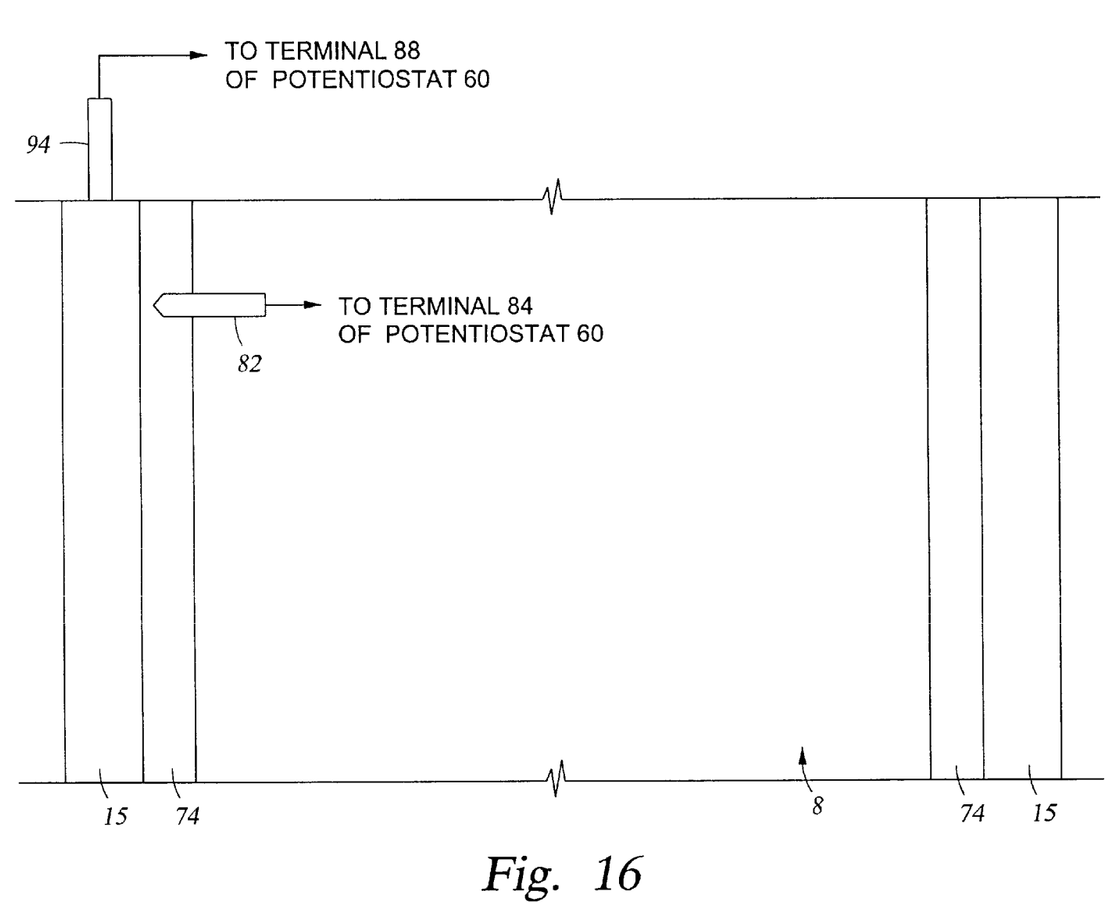
FIG. 16 is a schematic diagram for on-line monitoring of a layer or coating on the chamber wall of a plasma processing chamber or reactor.

In the preferred embodiment of the invention for on-line monitoring of a quality of a coating on the inside of a reactor chamber, there is seen in FIG. 16 a counter electrode 94 coupled to the chamber wall 15 (which functions as plate 70 of conducting material 72) and to counter electrode terminal 88 of the potentiostat 60. Working electrode 82 contacts the coating 74 supported by the chamber wall 15 and is coupled to working electrode terminal 84. The potentiostat 60 applies an a.c. signal between the counter electrode 94/chamber wall 15 and working electrode 82/coating 74 via counter electrode terminal 88 and working electrode terminal 84, respectively. On-line monitoring enables the coating 74 on the chamber wall 15 to be periodically checked for quality to determine if it is suitable to continue processing substrates 10. For example, after one or more substrates 10 have been processed, the chamber lid 16 may be opened to check and determine the quality of the coating 74 in accordance with the previously discussed procedures. If the coating 74 passes, one or more additional substrates 10 may be processed and the quality of the coating 74 may be checked and determined again in accordance with the previously discussed procedures. After each processing, the coating 74 is typically affected in some manner. While the chamber wall 15 has been illustrated in FIG. 16 for on-line monitoring, it is to be understood that the spirit and scope of the present invention includes other structural parts of the reactor chamber 8 and the coatings/layers associated therewith.

The invention will be illustrated by the following set forth examples which are being given to set forth the presently known best mode by way of illustration only and not by way of any limitation. All parameters such as concentrations, mixing proportions, temperatures, pressure, rates, compounds, etc., submitted in these examples are not to be construed to unduly limit the scope of the invention.

EXAMPLE I

EIS data analysis was carried out using the software written by H. Shih called "ANODAL" specially designed for anodize impedance spectra analysis. For type III anodization with hot DI water seal, the impedance spectra followed Model 2 as shown in FIG. 13. For one anodization supplier, the results are summarized in Table I.

TABLE I

The Interface Parameters of Type III Anodization with DI water Seal from Supplier #1

| Parameter | Coupon #1 | Coupon #2 | Coupon #3 | Coupon #4 | Coupon #5 |
|---|---|---|---|---|---|
| $R_b$ (ohms) | $3.5 \times 10^4$ | $3.0 \times 10^4$ | $3.0 \times 10^4$ | $3.0 \times 10^4$ | $3.5 \times 10^4$ |
| Cpo (farad) | $1.2 \times 10^{-8}$ | $1.2 \times 10^{-8}$ | $1.2 \times 10^{-8}$ | $1.2 \times 10^{-8}$ | $1.2 \times 10^{-8}$ |
| $\alpha 1$ | 0.90 | 0.98 | 0.95 | 0.98 | 0.86 |
| Rb (ohms) | $2.0 \times 10^8$ | $2.0 \times 10^8$ | $2.0 \times 10^8$ | $2.0 \times 10^8$ | $2.0 \times 10^8$ |
| Cb (farad) | $1.5 \times 10^{-5}$ | $1.5 \times 10^{-5}$ | $1.5 \times 10^{-5}$ | $1.5 \times 10^{-5}$ | $1.5 \times 10^{-5}$ |
| $\alpha 2$ | 1.00 | 1.00 | 1.00 | 1.00 | 1.00 |
| K (CPE) | $3.0 \times 10^5$ | $3.0 \times 10^5$ | $3.0 \times 10^5$ | $3.0 \times 10^5$ | $3.0 \times 10^5$ |
| n (CPE) | 0.38 | 0.38 | 0.38 | 0.38 | 0.38 |
| anodize thickness (mils)* | 3.10 | 3.10 | 3.10 | 3.10 | 3.10 |
| Barrier thickness in (A)# | 649 | 649 | 649 | 649 | 649 |

*the dielectric constant of anodize in 3.5 wt % NaCl aqueous solution is 55 as used in the reference and the actual thickness of anodize coupons was about 3.0 mils.
the dielectric constant in the calculation was assumed as 55 and the theoretical barrier layer thickness was between 600–720 Angstroms and $\alpha$ was related to surface roughness of anodize.

Figure 17:
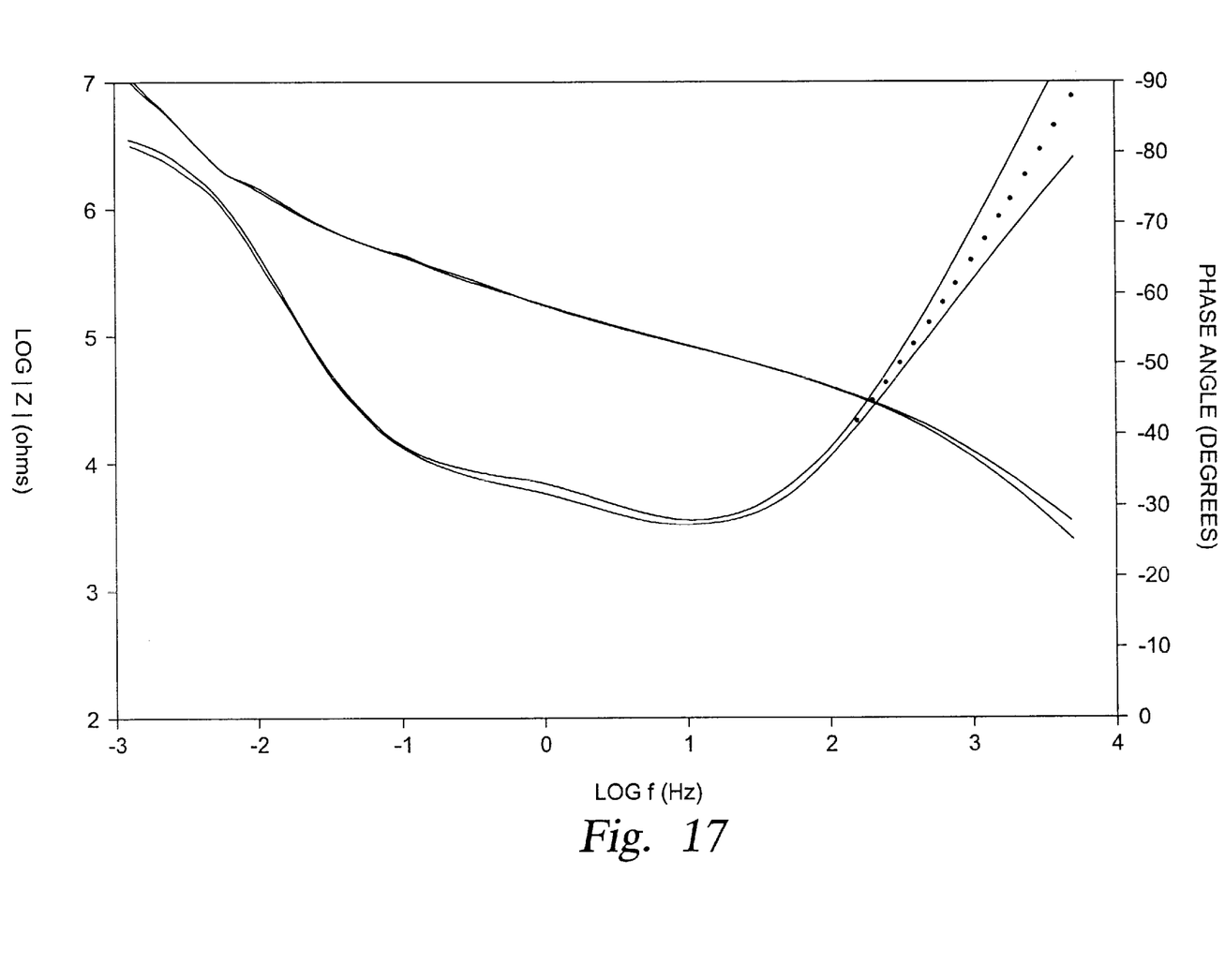
FIG. 17 is Bode impedance-phase angle plot for Example I demonstrating the scatter band technique as applied for type III anodize quality control.

The results show that the type III anodization with DI water sealing obtained from supplier #1 had both excellent quality control and high corrosion/erosion resistance. Both the porous and barrier layers were providing high corrosion/erosion resistance. In fact, a partially A-coated DPS chambers (i.e., reactor chamber 8) with the same supplier's type III anodize with the DI water sealing post treatment showed no corrosion/erosion after over 20 k wafer run. Using the software written by Shih for the calculation of scatter band of impedance, it was shown, that all of the impedance spectra from test coupons anodized from supplier #1 covering many different time periods fell within the same scatter band of impedance. The scatter band was built up using impedance spectra of Table I files and is shown in FIG. 17.

EXAMPLE II

Anodize coupons from another supplier were also evaluated by EIS. This anodize was produced using a mixed acid bath and not sealed. The average thickness of the four test coupons were 2.23 mils. EIS showed as Model 1 of FIG. 11 and the interface parameters of the test coupons are shown in Table II.

TABLE II

The Interface Parameters of Anodize without Seal from Supplier #2

| Parameter | Coupon #1 | Coupon #2 | Coupon #3 | Coupon #4 |
|---|---|---|---|---|
| $R_b$ (ohms) | $2.5 \times 10^6$ | $2.0 \times 10^5$ | $2.0 \times 10^6$ | $2.6 \times 10^6$ |
| Cb (farad) | $1.0 \times 10^{-5}$ | $1.0 \times 10^{-5}$ | $9.0 \times 10^{-6}$ | $1.0 \times 10^{-5}$ |
| $\alpha$ | 0.95 | 0.94 | 0.95 | 0.95 |
| Barrier thickness in Å | 433 | 433 | 430 | 433 |

$R_b$ values of this type anodize were almost two-orders of magnitude lower than the standard type III anodize with DI water seal as shown in Table I of EXAMPLE I. Large deviations of impedance spectra were observed on type "G" anodize. No. 2 test coupon had only an $R_b$ value of $2.0 \times 10^5$ ohms. The low corrosion/erosion resistance of type "G" anodize indicated that it could be used as DPS chamber wall anodize. In Beta testing, a partially A-coated DPS chamber with this anodize showed erosion/corrosion after only a 9000 wafer run. Erosion/corrosion of the anodize occurred at pumping port area with the anodization at these areas being worn completely away. The unsealed porous layer had no contribution to the overall erosion/corrosion resistance. Impedance spectra indicated that this anodize could not be used to build up a standard scatter band for coating acceptance because of the large deviation of impedance spectra from coupon to coupon.

CONCLUSION

Thus, by the practice of the present invention there is provided a method for determining the quality of a protective coating on the inside of a reactor chamber wherein substrates are processed within a plasma of a processing gas. Characteristics measured by EIS and captured in the scatter band related to the size and distribution of coating defects, i.e., cracks, inclusions, pores. By determining the proper scatter band to reflect the size and distribution of these defects, it was possible to produce type III anodize coating that solved the problem of chlorine (a gas for processing substrates) etch-processing chamber walls and other structures within the reactor chamber. Absorption of chlorine was severe enough that the end point instruments could not be used to calibrate mass flow controllers. After approximately 5 wet cleans the absorption was great enough that to calibrate mfcs, a new chamber body had to be installed. After instituting the scatter band control method of the present invention, the problem was resolved and no indication of chlorine absorption was seen.

Pitting of anodize is a problem that can occur if the barrier layer of the anodize has defects. Pitting can also be the result of surface damage, arcing, or extreme process parameters. Using the scatter band technique of the present invention enables liners, GDP's to be fitted before and after processing to determine that the anodize is acceptable for the process chamber conditions. Many times it was found that the anodize was capable of meeting process chamber requirements but was damaged from misuse.

Thickness of the barrier layer and porous layer can be determined by EIS. The quality of sealing done to the porous layer can also be determined. In this case scatter band replaces dielectric breakdown voltage testing, admittance testing and thickness testing as a method of surface layer property control.

Thus, by the further practice of the present invention there is provided an electrochemical impedance spectroscopy (EIS) and scatter band technique which may be applied to semiconductor industry. Introduction of the scatter band technique in combination with EIS data analysis and mathematical modeling to simulate anodize interface not only may be used to obtain the most critical information of anodize, but also provides a powerful tool for the quality control of the anodization. The use of the scatter band of the present invention may be a quality on line monitoring tool for anodize suppliers. DI water sealing and the quality control of the sealing process plays an important role in increases of the corrosion/erosion resistance of anodize. The combined contribution of the porous and barrier layers to the overall impedance of anodize coating demonstrates why type III anodize with proper anodize and sealing process control works for DPS R1 and DPS A-coated chambers.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spit of the present invention. It is intended that the invention not be limited to the particular embodiment(s) disclosed as the best mode contemplated for carrying out this invention, but that the invention will include all embodiments and equivalents falling within the scope of the appended claims.

What is claimed is:

1. A chamber assembly for processing substrates in a plasma, comprising:

a processing chamber including a processing zone wherein substrates are processed, wherein said processing chamber includes at least one conductive component, and wherein a protective chamber coating protects at least a portion of said conductive component surface;

a pedestal assembly disposed in said processing zone and having a receiving surface for receiving a substrate;

a first electrode contacting said protective chamber coating;

a second electrode coupled to a portion of said conductive component, a surface of which is protected by said protective chamber coating;

an EIS measurement and data acquisition system working in combination with said first electrode and said second electrode;

at least one processing power source;

a processing gas-introducing assembly, engaged to said processing chamber, for introducing at least one processing gas into said processing zone; and at least one processing power-transmitting member connected to said at least one processing power source, for transmitting power into said processing zone, to aid in sustaining a plasma from a processing gas within said processing zone.

2. The chamber assembly of claim 1 wherein said processing chamber comprises a chamber wall supporting a dielectric window.

3. The chamber assembly of claim 1 wherein said protective chamber coating is present on a conductive wall of said processing chamber, and said second electrode is coupled to said conductive chamber wall.

* * * * *